(12) United States Patent
MacLellan et al.

(10) Patent No.: US 6,505,321 B1
(45) Date of Patent: Jan. 7, 2003

(54) FAULT TOLERANT PARITY GENERATION

(75) Inventors: Christopher S. MacLellan, Norwood, MA (US); John K. Walton, Mendon, MA (US)

(73) Assignee: EMC Corporation, Hopkinton, MA (US)

(*) Notice: Subject to any disclaimer, the term of this patent is extended or adjusted under 35 U.S.C. 154(b) by 0 days.

(21) Appl. No.: 09/315,437

(22) Filed: May 20, 1999

(51) Int. Cl.[7] .................... G06F 11/00; H03M 13/00
(52) U.S. Cl. .................... 714/802; 714/52; 714/802
(58) Field of Search .................... 714/802, 804, 714/805, 18, 801, 19, 43, 50, 52, 748, 6, 42, 45, 54, 766, 800

(56) References Cited

U.S. PATENT DOCUMENTS

| | | | |
|---|---|---|---|
| 4,245,344 A | | 1/1981 | Richter .................... 714/43 |
| 4,346,474 A | * | 8/1982 | Sze .................... 714/802 |
| 4,546,475 A | * | 10/1985 | Sharpless et al. .................... 714/716 |
| 4,580,265 A | | 4/1986 | Gooding et al. .................... 714/802 |
| 4,621,323 A | | 11/1986 | Mayhew .................... 714/18 |
| 4,734,909 A | | 3/1988 | Bennett et al. .................... 370/462 |
| 5,117,428 A | * | 5/1992 | Jeppesen, III et al. .................... 714/45 |
| 5,412,671 A | * | 5/1995 | Tsuchiya .................... 714/805 |
| 5,619,642 A | * | 4/1997 | Nielson et al. .................... 714/6 |
| 5,905,854 A | * | 5/1999 | Nielson et al. .................... 714/6 |

FOREIGN PATENT DOCUMENTS

JP  2094722  5/1990  ............. H04L/1/00

* cited by examiner

*Primary Examiner*—Emmanuel L. Moise
(74) *Attorney, Agent, or Firm*—Daly, Crowley & Mofford, LLP

(57) ABSTRACT

A method and system for providing parity protection to data. The method and system includes transmitting pairs of groups of bits. Each one of the groups of bits has bits representing the data and a parity bit. The parity sense of one of the pair of groups of bits is opposite to the parity sense of the other one of the pair of groups of bits. The transmitted pair of groups of bits are received. The received pair of groups of bits are parity checked to determine whether the parity sense of one of the received pair of groups, of bits is opposite to the parity sense of the other one of the received pair of groups of bits. With such an arrangement, a failure in the data driver or data receiver which causes the output of all bits produced by such driver to assume the same logic state can be detected because the received pair of groups of bits will have, with such failure, the same parity sense. The method and system also includes transmitting successive groups of bits in response to clock pulses. With such an arrangement, a method and system are provided for detecting a failure in the clock pulses because such a failure will result in the absence of an alternating parity sense in the successively received groups of bits.

20 Claims, 8 Drawing Sheets

Parity Checker 16A (No Faults)

| Input | $GA_{R1}$ | $GA_{R2}$ | $GA_{R3}$ | $GA_{R4}$ |
|---|---|---|---|---|
| Output | 1 | 0 | 1 | 0 |

Parity Checker 16B (No Faults)

| Input | $GB_{R1}$ | $GB_{R2}$ | $GB_{R3}$ | $GB_{R4}$ |
|---|---|---|---|---|
| Output | 0 | 1 | 0 | 1 |

→ Time

FIG. 5

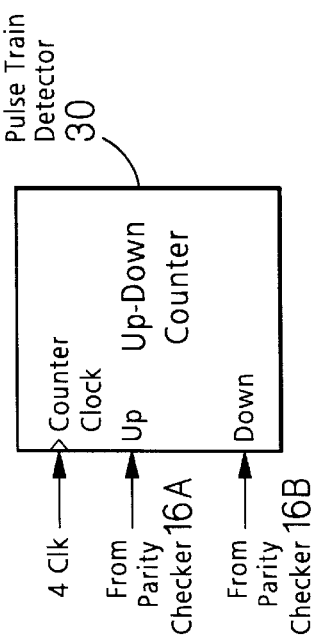

FIG. 6

| DATA Source 18 | DATA $D_1$ | DATA $D_2$ | DATA $D_3$ | DATA $D_4$ |
|---|---|---|---|---|
| Clock Pulses | $CLK_1$ | $CLK_2$ | $CLK_3$ | $CLK_4$ |
| Input to DATA Driver 18A | $GA_{T1}$ (BYTE $A_{T1}$, $PA_{T1}$) Odd Parity | $GA_{T2}$ (BYTE $A_{T2}$, $PA_{T2}$) Even Parity | $GA_{T3}$ (BYTE $A_{T3}$, $PA_{T3}$) Odd Parity | $GA_{T4}$ (BYTE $A_{T4}$, $PA_{T4}$) Even Parity |
| Input to Driver 18B | $GB_{T1}$ (BYTE $B_{T1}$, $PB_{T1}$) Even Parity | $GB_{T2}$ (BYTE $B_{T2}$, $PB_{T2}$) Odd Parity | $GB_{T3}$ (BYTE $B_{T3}$, $PB_{T3}$) Even Parity | $GB_{T4}$ (BYTE $B_{T4}$, $PB_{T4}$) Odd Parity |

FIG. 4

FAULT TOLERANT PARITY GENERATION

BACKGROUND OF THE INVENTION

This invention relates generally to fault tolerant parity generation.

As is known in the art, data is typically transferred from a source to a destination, or target, through a data driver and a data receiver. More particularly, referring to FIG. 1, a parallel bus data transmission system is shown to include a data source which produces a sequence of N bit digital data to be transmitted to a data target. Here, the data from the data source is transmitted over a backplane. The data produced by the data source is fed first to a data driver. The driver is used to provide sufficient power to drive the backplane. The data on the backplane is then fed to a data receiver. The data receiver is a high input impedance device, or buffer, used to isolate the data target from the backplane (i.e., to reduce loading on the backplane).

In order to provide some assurance of data transfer between the data source and the data target, the N bit data produced by the data source has appended to it an additional bit, i.e., a parity bit, as shown in FIG. 2. The parity bit is representative of the number of logic 1 states in the N bit digital word. For example, if there are an odd number of logic 1 bits in the N bit word, a logic 0 parity bit may be appended to the word. In such case, the parity sense of the appended word is sometimes referred to as odd parity. In other cases, if there are an odd number of logic 1 bits in the N bit word, a logic 1 parity bit may be appended to the word. In such case, the parity sense of the appended word is referred to as even parity. In either case, the N plus one bit word is checked for parity sense by a parity checker at the output of the data receiver. A byte 00100101 protected with even parity has a logic 1 parity bit. The byte 00100101 protected with odd parity has a logic 0 parity bit. Thus, parallel data transmission with parity protection over the data is provided, given the parity bit correctly corresponds with the given protection sense, odd or even.

Typically, the data on the backplane shown in FIGS. 1 and 2 is segmented into groups, typically bytes, where a byte is eight bits. Thus, for example, with a 72 bit backplane bus, there are 9 bytes. Furthermore, the parity scheme of FIG. 2 is typically byte-parity, where one parity bit is generated for each byte of data. Thus, with the 72 bit backplane bus, there are 8 bytes of data and 8 parity bits.

SUMMARY OF THE INVENTION

In accordance with the present invention, a method and system are provided for providing parity protection to data. The method and system include transmitting data as a pair of groups of bits, one of the pair having odd parity and the other one of the pair having even parity. Embodiments of this method and system include transmitting the groups of bits in parallel and/or sequentially.

In accordance with another aspect of the invention a method and system are provided for providing parity protection to data. The method and system includes transmitting data as a pair of sequential transmitted groups of bits, one of the pair having odd parity and the other one of the pair having even parity.

In accordance with another aspect of the invention, a method and system are provided for providing parity protection to data. The method and system transmit a pair of groups of bits. Each one of the groups of bits has bits representing the data and a parity bit. The parity sense of one of the pair of groups of bits is opposite to the parity sense of the other one of the pair of groups of bits. The transmitted pair of groups of bits is received and their parity is checked to determine whether the parity sense of one of the received pair of groups of bits is opposite to the parity sense of the other one of the received pair of groups of bits.

With such an arrangement, a failure in the data driver or data receiver, which causes the output of all bits produced by such driver, or receiver, to assume the same logic state, can be detected because the received pair of groups of bits will have, with such failure, the same parity sense rather than the opposite parity sense as such groups of bits were transmitted.

In accordance with another feature of the invention, a method and system are provided for providing parity protection to data. The method and system includes transmitting successive groups of bits in response to clock pulses. Each one of the groups of bits has bits representative of the data and a parity bit. The parity sense of the groups of bits alternates as such groups are successively transmitted. The transmitted groups of bits are successively received in response to the clock pulses. The successively received groups are parity checked to determine whether the parity sense of the successively received groups of bits alternate with the clock pulses.

With such an arrangement, a method and system are provided for detecting a failure in the clock pulses because such a failure will result in the absence of an alternating parity sense in the successively received groups of bits.

BRIEF DESCRIPTION OF THE DRAWING

These and other features of the invention will become more readily apparent from the following detail description when read together with the accompanying drawings, in which:

FIG. 4 is a timing diagram showing a sequence of data being clocked, with one group of bits of such data having an alternating sequence of parity sense and another group of such bits of the data having an opposite alternating sequence of parity sense;

FIG. 5 is a timing diagram showing inputs and outputs of a pair of parity checkers used in the system of FIG. 3, such outputs being shown in the absence of faults in the system;

FIG. 6 is a schematic diagram of a pulse train detector used in the system of FIG. 3, such detector being adapted to detect a fault in such system;

DESCRIPTION OF THE PREFERRED EMBODIMENTS

Figure 1:
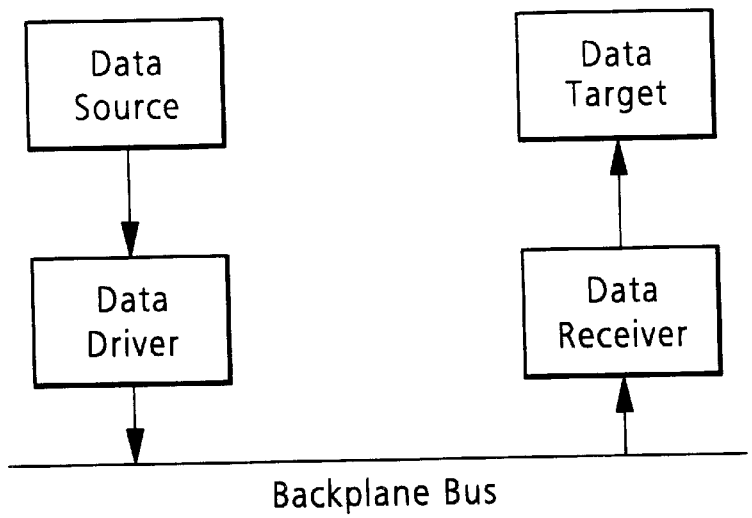
FIG. 1 is a data transmission system according to the PRIOR ART.
Figure 2:
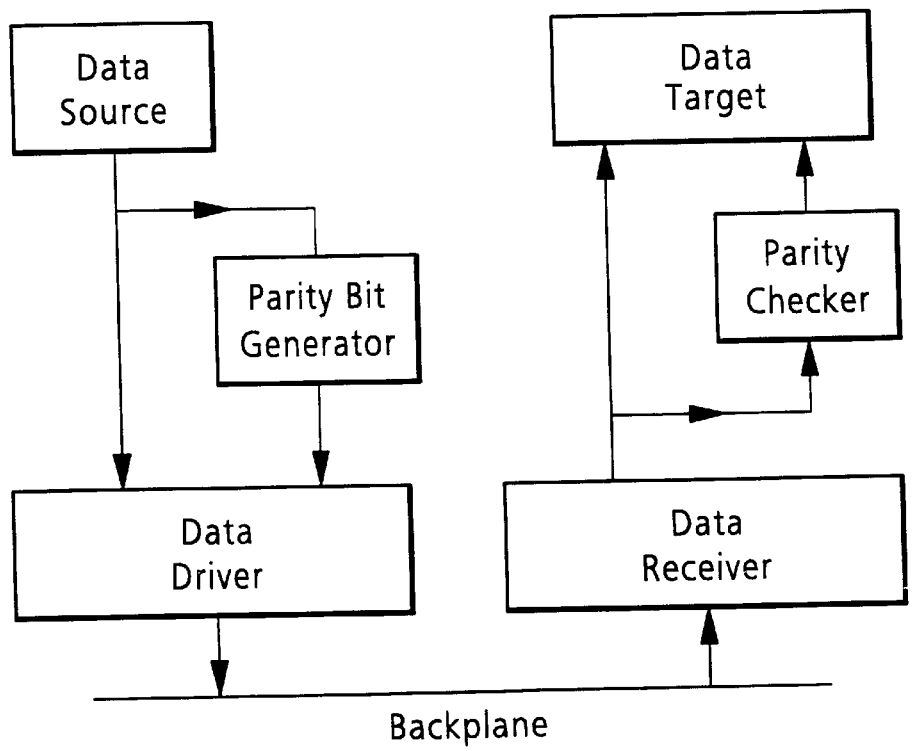
FIG. 2 is a data transmission system having parity checking according to the PRIOR ART.
Figure 3:
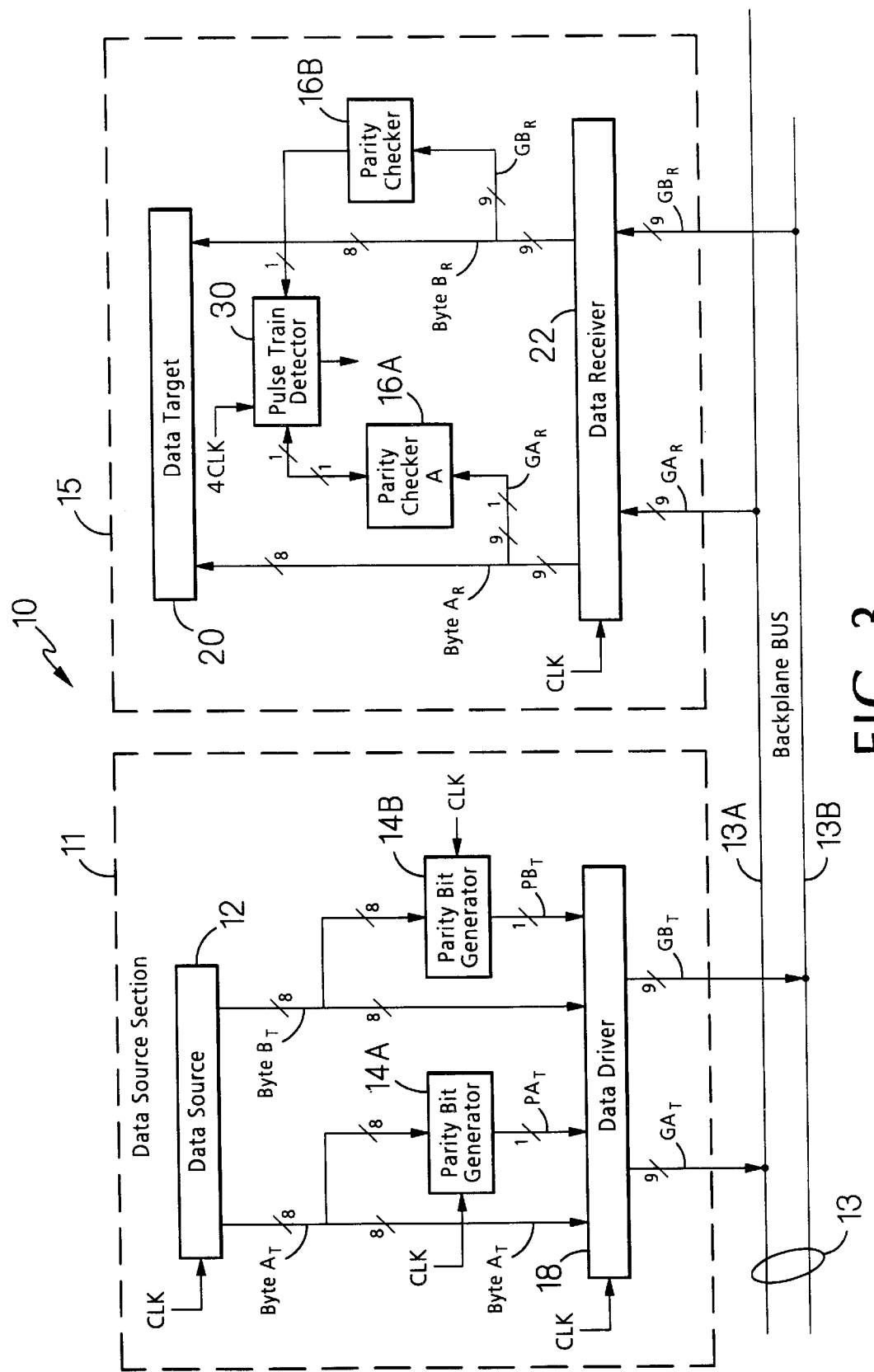
FIG. 3 is a data transmission system according to the invention.

Referring now to FIG. 3, a system 10 is shown adapted to provide parity protection to data. The system 10 includes a data source section 11 for successively transmitting data in response to clock pulses, CLK. Each transmitted data, D, includes a pair of groups of bits, $GA_T$, $GB_T$. Each one of the groups of bits $GA_T$, $GB_T$ has bits representing data from a data source 12 (i.e., BYTE $A_T$, BYTE $B_T$, respectively) and a parity bit provided by parity bit generators 14A, 14B, respectively, (i.e., $PA_T$, $PB_T$, respectively). (It should be understood that while two bytes are used for purposes of understanding, a more typical application may include, for example, eight bytes. In such case, there would be formed four pairs of bytes.) Here, in this example using a pair of bytes produced by the data source 12, BYTE $A_T$ and BYTE $B_T$, each of the two bytes, BYTE $A_T$, BYTE $B_T$, is fed to a corresponding one of the pair of parity bit generators 14A, 14B, respectively, as indicated. The output $PA_T$, $PB_T$, of the parity bit generators 14A, 14B together with BYTE $A_T$ and BYTE $B_T$, provide the pair of groups of bits, i.e., group of bits $GA_T$ and group of bits $GB_T$, respectively. The parity sense of one of the pair of groups of bits is opposite to the parity sense of the other one of the pair of groups of bits. Further, the parity sense of the each of the pair of groups of bits $GA_T$, $GB_T$, alternates successively with the clock pulses CLK.

More particularly, and referring to FIG. 4, as data $D_1$, $D_2$, $D_3$, . . . is sequentially produced by the data source 12, the parity sense of the group of bits $GA_T$ alternates sequentially in response to the clock pulses, and concurrently therewith, the parity sense of the group of bits $GB_T$ alternates with opposite parity sense in response to the clock pulses CLK. Further, the parity sense provided by parity generator 14A alternates in response to clock pulses CLK, the default, or initial, parity sense being, here odd parity. Conversely, the parity sense provided by parity generator 14B alternates in response to clock pulses CLK, the default, or initial, parity sense being, here even parity.

Thus, as shown in FIG. 4, for the sequence of data $D_1$, $D_2$, $D_3$, $D_4$, . . . , the first group of bits $GA_T$ are: $GA_{T1}$; $GA_{T2}$; $GA_{T3}$; $GA_{T4}$; . . . , and the parity sense of such sequence of the first group of bits is: odd; even; odd; even; . . . respectively, while, the parity sense sequence of the second group of bits $GB_{T1}$; $GB_{T2}$; $GB_{T3}$; $GB_{T4}$; . . . . is, in such case: even; odd; even; odd; . . . , respectively. Thus, if the parity sense of the first group of bits, $GA_T$ has an even parity sense, the parity sense of the second group of data $GB_T$ has an odd parity sense. Conversely, if the parity sense of the first group of bits $GA_T$ (i.e., BYTE $A_T$ and parity bit $PA_T$) has an odd parity sense, the parity sense of the second group of bits $GB_T$ (i.e., BYTE $B_T$ and parity bit $PB_T$) has an even parity sense.

The data source section 11 includes a data driver 18 for coupling the groups of bits $GA_T$, $GB_T$, respectively to the busses 13A, 13B, respectively. Here, the data driver 18 includes a register, not shown, adapted to store the two bytes, i.e., BYTE $A_T$ and BYTE $B_T$, and the parity bits $PA_T$ and $PB_T$ associated with such BYTES $A_T$ and $B_T$, respectively, in response to a clock pulse CLK fed to such driver 18.

The system 10 (FIG. 3) also includes a backplane bus 13 for receiving the sequentially transmitted data. For each transmitted data, i.e., the transmitted pair of groups of bits $GA_T$, $GB_T$, are fed, in parallel, i.e. in the same state or clock cycle CLK, to a corresponding pair of busses 13A, 13B, respectively, of bus 13.

A data receiver section 15 is provided for receiving the pair of groups of bits on busses 13A, 13B, in parallel, such received groups of bits being designated as $GA_R$, $GB_R$, respectively, where group of bits $GA_R$ includes a data BYTE $A_R$ and associated parity bit $PA_R$ and group of bits $GB_R$ includes a data BYTE $B_R$ and associated parity bit $PB_R$. It is noted that, in the absent of any fault in the transmission of the groups $GA_T$, $GB_T$ through the busses 13A, 13B, respectively, the received group of bits $GA_R$ will be the same as the transmitted group of bits $GA_A$ and, likewise, the received group of bits $GB_R$ will be the same as the transmitted group of bits $GB_T$.

The data receiver section 15 includes a data receiver 22. The data receiver 22 is coupled to bus 13A to receive the group of bits $GA_R$ and to bus 13B to receive the group of bits $GB_R$. Here, the data receiver 22 includes a register, not shown, adapted to store the two groups of bits $GA_R$, $GB_R$ in response to clock pulse CLK fed to data receiver 22.

The data receiver section 15 also includes a pair of parity checkers 16A, 16B coupled to the data receiver 22, as shown. The parity checkers 16A, 16B perform a parity check on the received pair of groups of bits $GA_R$, $GB_R$, respectively, to determine whether the parity sense of one of the received pair of groups of bits is opposite to the parity sense of the other one of the received pair of groups of bits. Both groups of bits $GA_R$, $GB_R$ are sequentially fed to the parity checkers 16A, 16B, respectively, in response to the data receiver 22 storing both groups $GA_R$, $GB_R$ in response to the clock pulses CLK. That is, in sequence to $CLK_1$, $CLK_2$, both $GA_{R1}$, $GB_{R1}$, and $GA_{R2}$, $GB_{R2}$ are sent to parity checkers 16A, 16B. The parity checkers 16A, 16B will produce a logic output having a first logic state, here for example a logic 1, if the group of bits to it have an odd parity sense and the opposite logic state, here a logic 0, if the group of bits fed to it have an even parity sense.

Thus, and referring also to FIG. 5, with the parity sense of the sequence of groups of bits $GA_{R1}$, $GA_{R2}$, . . . changing in response to the clock pulses, absent a fault, the parity checker 16A will change from logic 1 to logic 0, etc., with the clock pulses CLK, as shown in FIG. 5. Thus, in the absence of a fault, it is noted that there is a train of pulses produced by parity checker 16A (i.e., 1010 . . . ).

In like manner, with the parity sense of the sequence of groups of bits $GB_{R1} GB_{R2}$, . . . changing in response to the clock pulses, absent a fault, the parity checker 16A will change from logic 0 to logic 1, etc., with the clock pulses CLK, as shown in FIG. 5. Thus, in the absence of a fault, it is noted that there is a train of pulses produced by parity checker 16B (i.e., 0101 . . . ).

Figure 7:
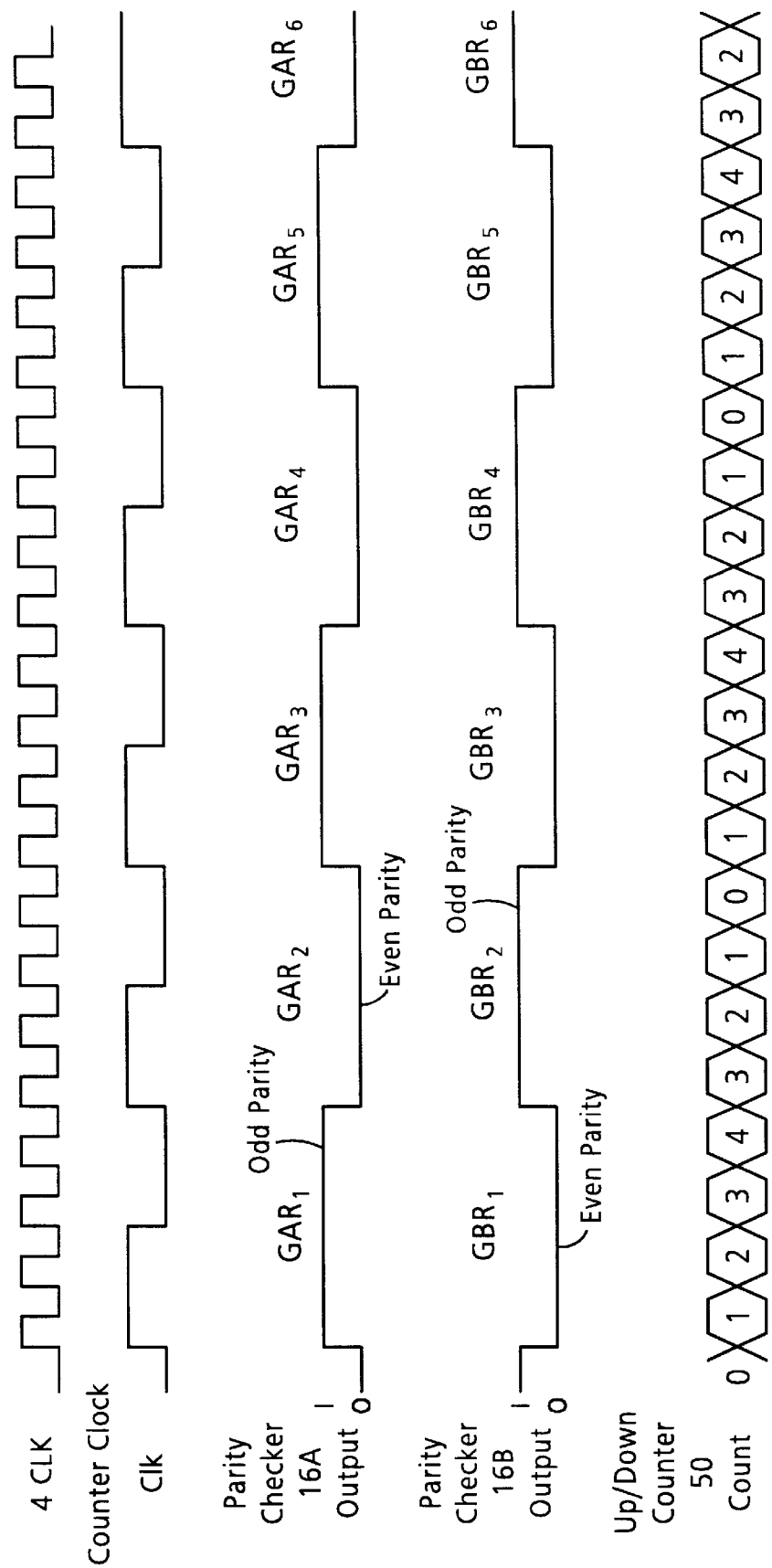
FIG. 7 is a timing diagram showing outputs of a pair of parity checkers and the output of the pulse train detector of FIG. 6, such outputs being shown in the absence of a fault in the system.

The outputs of the parity checkers 16A, 16B are fed to a pulse train detector 30, here a three bit up/down counter, as shown in FIG. 6. Also fed to the pulse train detector 30 is a clock pulse, 4CLK, having a rate 4 times the clock rate fed to the data source 12, parity bit generators 14A, 14B, data driver 18 and data receiver 22, as indicated in FIG. 7. The UP input of the counter is fed by the output of parity checker 16A and the COUNTER CLOCK input is fed by 4CLK (i.e., clock pulse at 4 times CLK). The contents of counter 30 will increment by one from an initial reset count of 0 to a maximum count of 7 in response to each one of the clock pulses fed to the COUNTER CLOCK input thereof when the output of the parity checker 16A is logic 1 (i.e., when the parity checker 16A indicates odd parity). The DOWN input is fed by the output of the parity checker 16B. The contents of counter 30 will decrement by one in response to each one of the clock pulses fed to the COUNTER CLOCK input thereof when the output of the parity checker 16B is logic 1 (i.e., when the parity checker 16B indicates odd parity). Thus, in the absence of a fault, the contents of the counter 30 increment by one from an initial reset count of 0 to a count of 4 when parity checker 16A produces a logic 1 and then the contents of the counter decrement by one from the count of 4 to a count of zero when the parity checker 16B produces a logic 1. It is noted that absent a fault the contents of the counter 30 will never be the same value for two consecutive clock pulses fed to the COUNTER CLOCK input. It is further noted that the contents of counter 30 will hold its count value in response each one of the clock pulses fed to the COUNTER CLOCK input thereof should the output from both parity checker 16A and parity checker 16B be the same.

Figure 8:
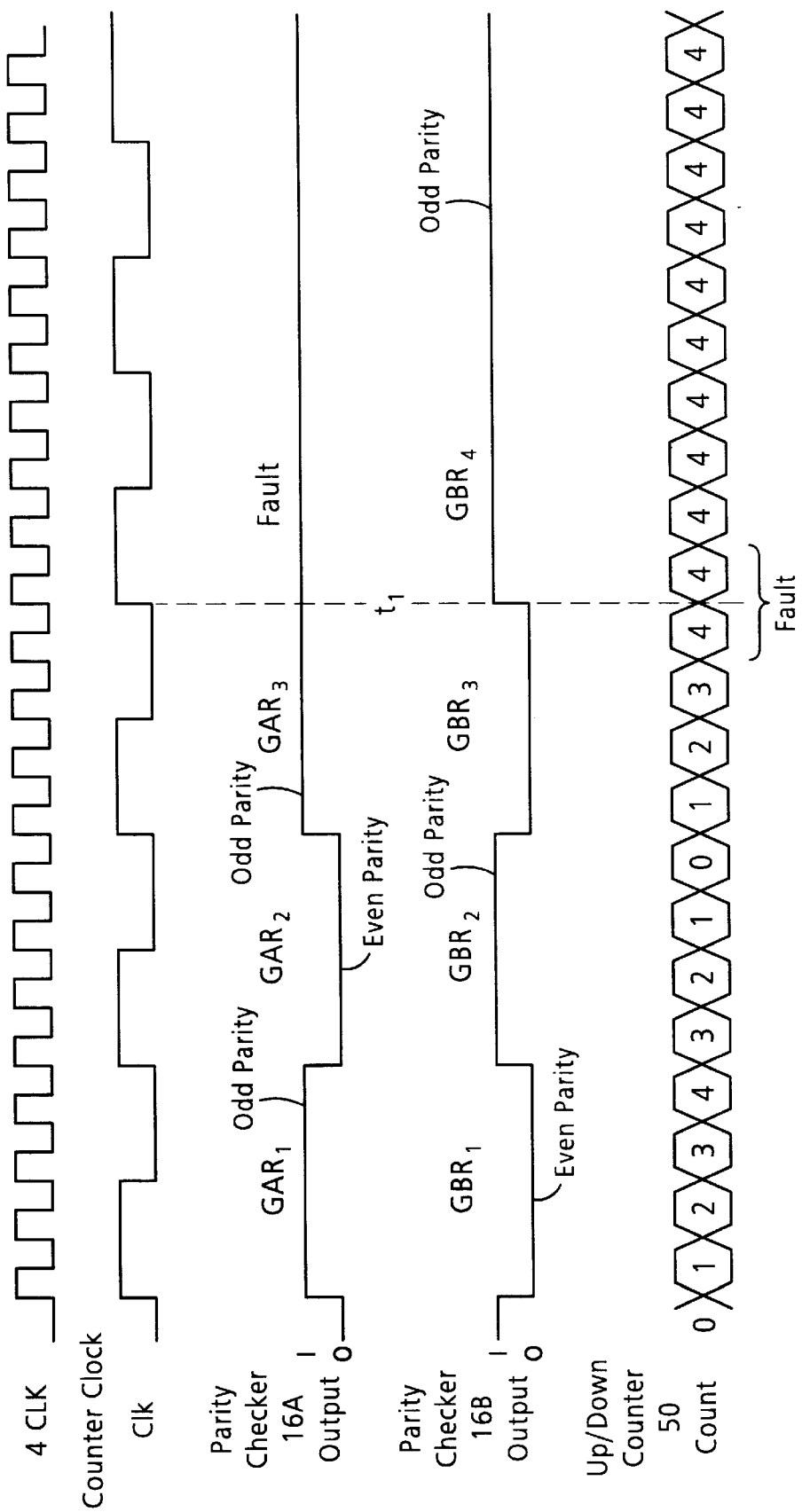
FIG. 8 is a timing diagram showing outputs of a pair of parity checkers and the output of the pulse train detector of FIG. 6, such outputs being shown in the presence of one type of fault in the system.

Referring now to FIG. 8, an example is presented where there is a fault in system 10 (FIG. 3). Here, the fault is such that the data driver 18 has its output "stuck" at time $t_1$ so that it produces all logic 1s, as indicated. That is all 18 bits at the output of the driver 18 are logic 1 (i.e., group of bits $GA_R$ and group of bits $GB_R$ will both have odd parity). Thus, the output of parity checker 16A will continue to indicate odd parity and therefore continue to produce a logic 1 and the output of parity checker 16B will change to also indicate odd parity. Therefore, the contents of the counter 30 will be unable to count, i.e. freeze, holding the counter at a count of 4 in this example, as shown. A fault is therefore detected because the contents of counter 30 does not change for two consecutive clock pulses fed to the COUNTER CLOCK input.

Figure 9:
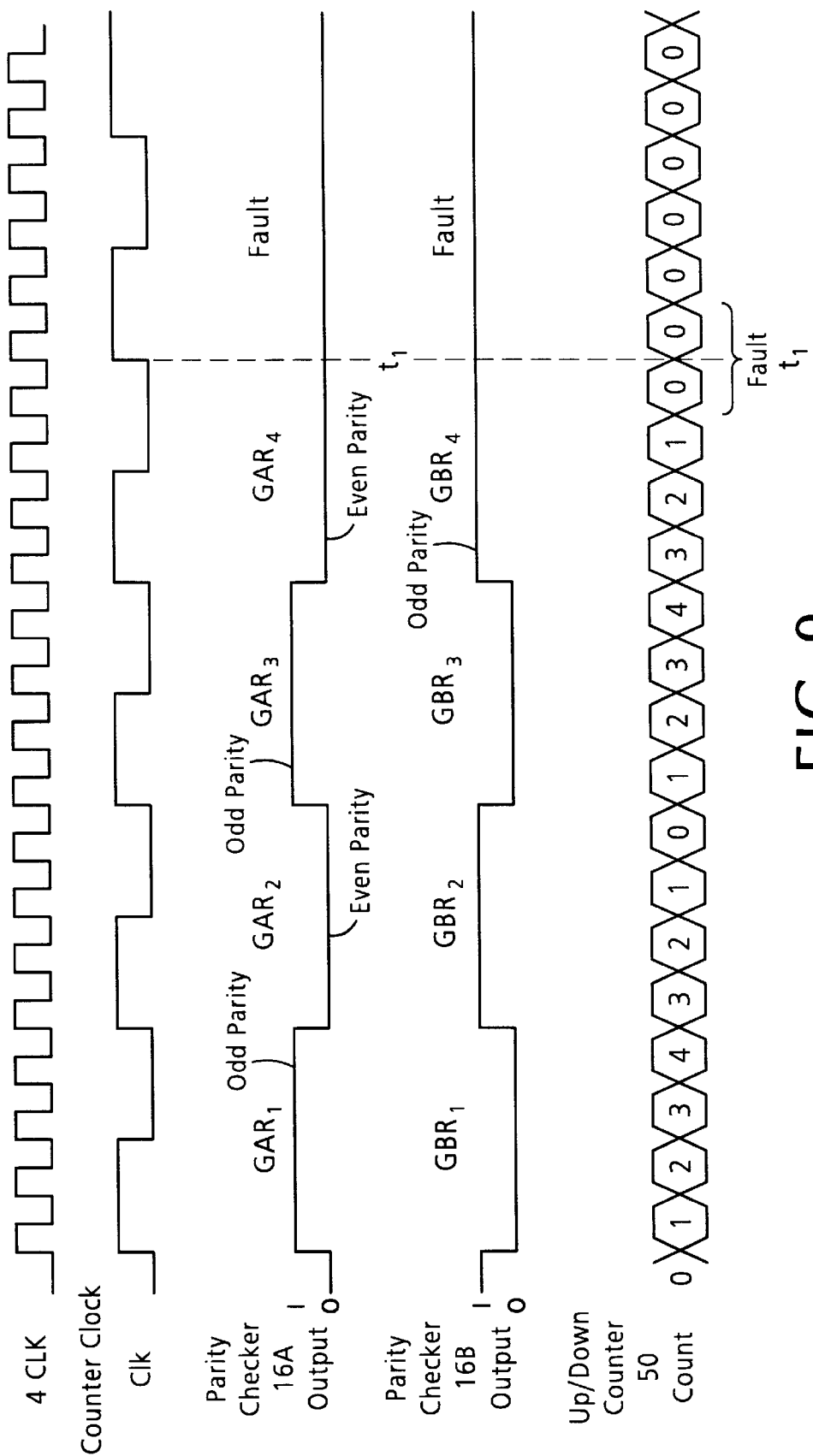
FIG. 9 is a timing diagram showing outputs of a pair of parity checkers and the output of the pulse train detector of FIG. 6, such outputs being shown in the presence of another type of fault in the system.

Referring to FIG. 9, an example is presented where there is a different type of fault in system 10 (FIG. 3). Here, the fault is that the data driver 18 fails to respond to a clock pulse CLK at time $t_1$. That is, the same group of bits $GA_T$ and $GB_T$ remain, here at even parity and odd parity, respectively in the data driver 18 for two consecutive clock pulses CLK even though the parity bit generators 14A and 14B have changed the parity sense for these two consecutive clock pulses CLK. Thus, in this example, the parity of group of bits $GA_R$ will remain at even parity for the two consecutive clock pulses CLK and the group of bits $GB_R$ will remain at odd parity for the two consecutive clock pulses CLK. Thus, the counter 30 will be enabled to decrement in response to the clock pulse 4CLK fed to the COUNTER CLOCK terminal thereof; however, the contents of such counter 30 cannot decrement to less than a count of 0. Therefore, a fault is therefore detected because the contents of counter 30 will remain at the same count, here a count of 0, for two consecutive clock pulses fed to the COUNTER CLOCK input.

Figure 10:
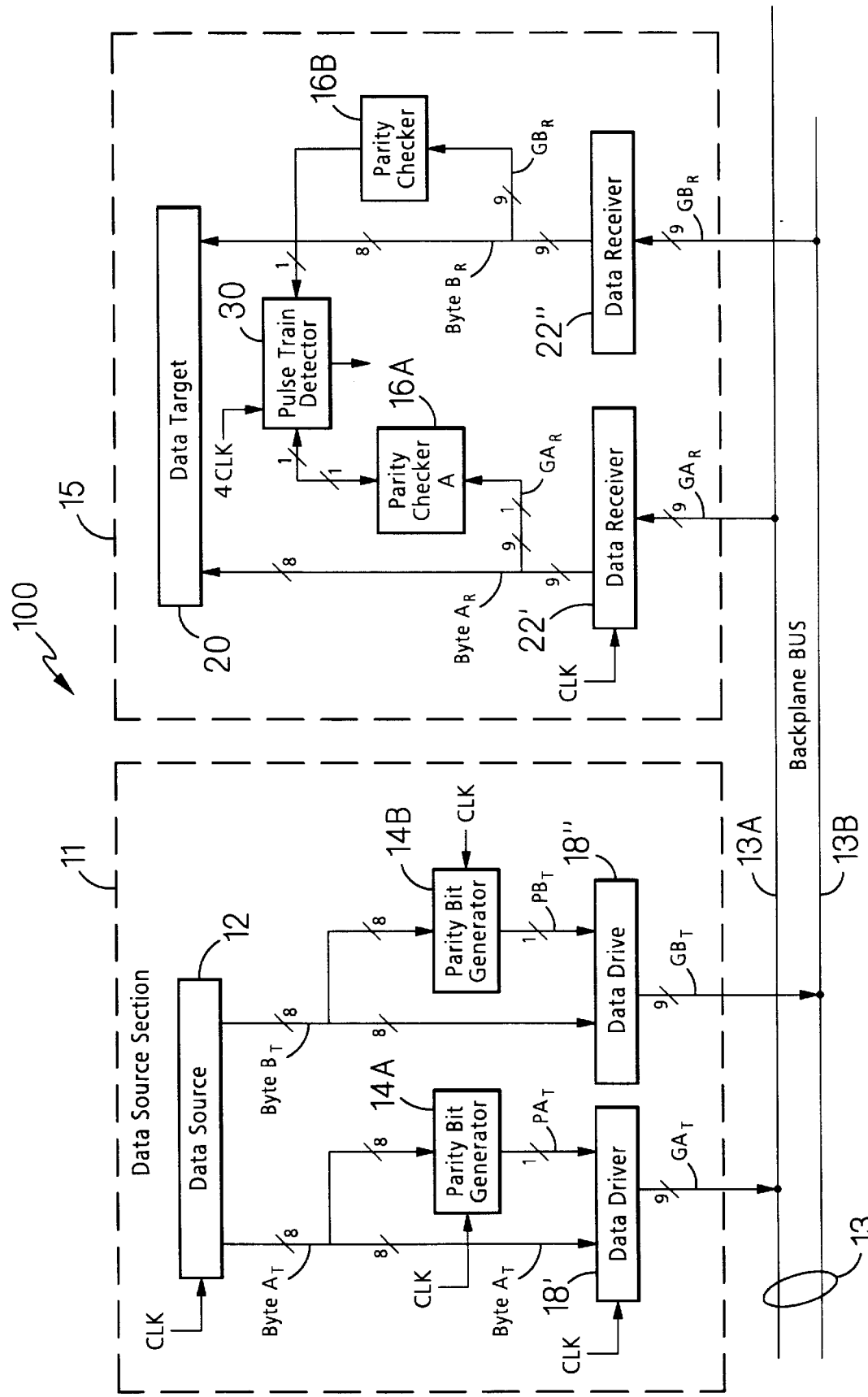
FIG. 10 is a data transmission system in according to the invention.

Referring to FIG. 10, system 100 is an alternative embodiment of FIG. 3 wherein the elements having the same numerical designator as described above in association with FIG. 3 provide substantially the same function in system 100 as the corresponding elements in system 10. However, system 100 replaces data driver 18 in FIG. 3 with a group of data drivers, here 18' and 18". Data drivers 18', 18" serve to couple groups of bits $GA_T$, $GB_T$, respectively to busses 13A and 13B, respectively. System 100 also replaces data receiver 22 in FIG. 3 with a group of data receivers, here 22' and 22". Data receivers 22', 22" are also coupled to busses 13A and 13B, respectively and function to receive groups of data bits $GA_R$, $GB_R$, respectively, transmitted over bus 13.

Figure 11:
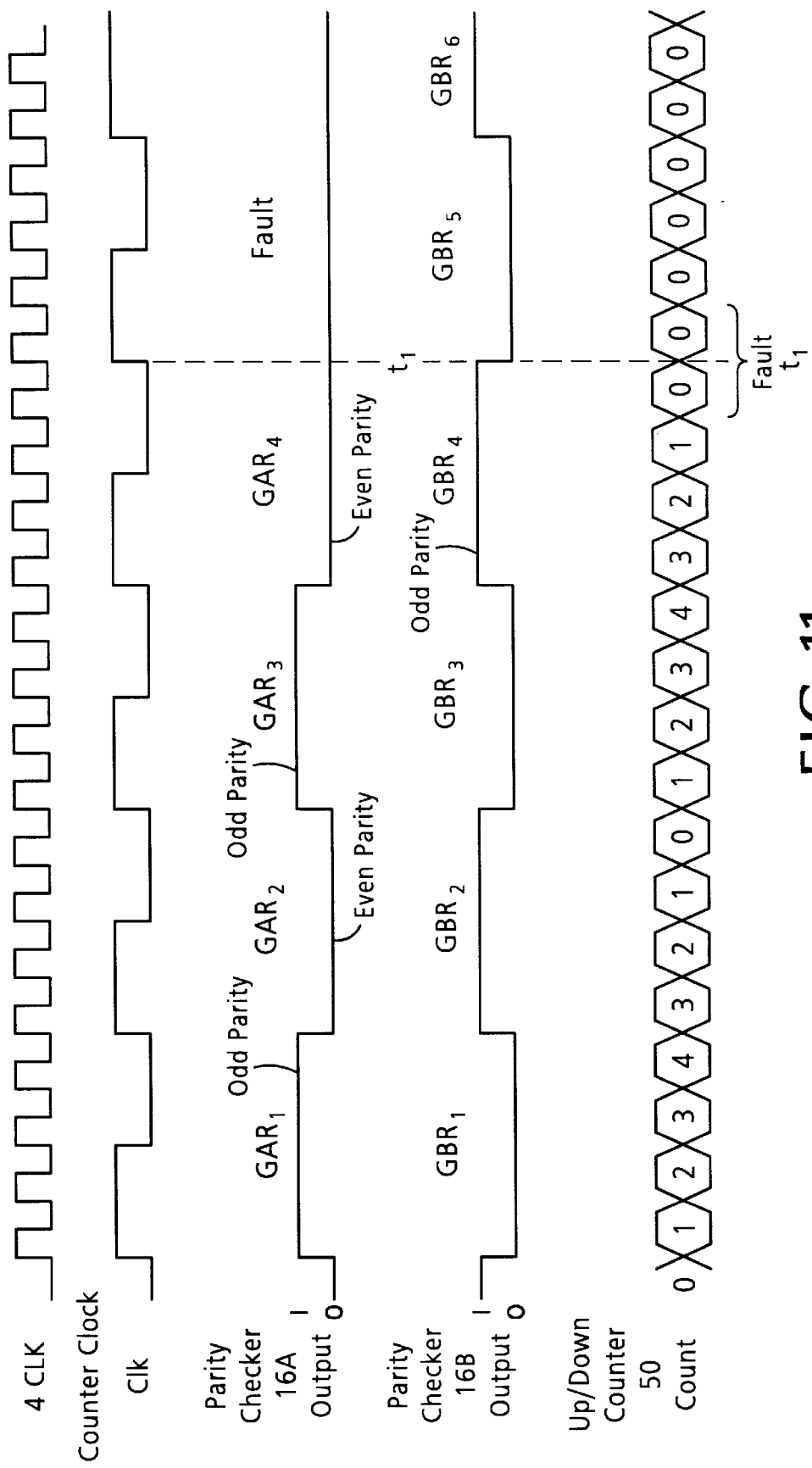
FIG. 11 is a timing diagram showing outputs of a pair of parity checkers and the output of the pulse train detector of FIG. 10, such outputs being shown in the presence of another type of fault in the system.

Referring to FIG. 11, an example is presented where a sequential type fault occurs in system 100 (FIG. 10). Here, the data driver 18' fails to respond to a clock pulse CLK at time $t_1$. That is, the same group of bits $GA_T$ remain in the driver 18', here at even parity, respectively, for two consecutive clock pulses CLK even though the parity bit generators 14A and 14B have changed the parity sense for these two consecutive clock pulses CLK. Thus, in this example, the parity of group of bits $GA_R$ will remain even parity for the two consecutive clock pulses CLK and the group of bits $GB_R$ will continue to alternate parity. Thus, when signals $GA_R$ and $GB_R$ are non complementary, i.e. when both are logic 1 or logic 0, counter 30, the pulse train detector, will be unable to count in response to the clock pulse 4CLK fed to the COUNTER CLOCK terminal thereof. Therefore, a fault is detected because the contents of counter 30 will remain at the same count, here a count of 0, for two consecutive clock pulses 4CLK fed to the COUNTER CLOCK input.

Thus, in summary, it is noted that pulse train detector 30 is provided for detecting the presence of both faults in parallel data transmissions, i.e. same state or CLK faults, as in FIG. 8, and faults in consecutive data transmissions, i.e. sequential state faults, as in FIGS. 9 and 11.

Same state faults are detected when the parity sense between parallel groups of transmitted bits, i.e. groups of bits received in the same CLK cycle or state, are the same. Such faults are detected when the pair of the group of received bits $GA_{Rn}$ has the same parity sense as the other pair of the group of bits $GB_{Rn}$. In other words, a same state fault is detected when the parity sense of the groups of bits received in parallel, $GA_{Rn}$, $GB_{Rn}$, do not oppose each other.

Sequential state faults are detected when the parity sense between sequential groups of received bits are the same. Such faults are detected when the one group of received bits, $GA_{Rn}$, (or $GB_{Rn}$), has the same parity sense as the next sequential group of received bits, $GA_{Rn+1}$, (or $GB_{Rn+1}$). In other words, a sequential state fault is detected when the parity sense of sequentially received groups of bits do not alternate, or toggle, in their parity sense.

Other embodiments are within the spirit and scope of the appended claims.

What is claimed is:

1. A method for transmitting data, such method comprising:
    transmitting data as a sequence of data words, each one of the data words having a pair of groups of bits, one of the pair of groups having odd parity and the other one of the pair of groups having even parity.

2. The method for transmitting data in claim 1 wherein the pair of groups of bits are transmitted in parallel.

3. The method for transmitting data in claim 1 wherein the data words each comprise a pair of bytes of data, one of the pair of bytes being one of the pair of groups of bits of such data word and the other one of the pair of bytes being the other one of the pair of groups of bits of such data word.

4. A method for providing parity protection to data, such method comprising:
    transmitting a sequence of data words in response to a sequence of clock pulses, each one of the words comprising a pair of groups of bits, one of the pair of groups of bits having odd parity and the other one of the pair of groups of bits having even parity;
    detecting errors in the transmission by passing the transmitted sequence of data and the clock pulses to an up/down counter.

5. A method for providing parity protection to data, such method comprising:

transmitting a sequence of data words, each one of the data words having a pair of groups of bits, each one of the groups of bits having bits representing the data and a parity bit, the parity sense of one of the pair of groups of bits being opposite to the parity sense of the other one of the pair of groups of bits in such one of the words;

receiving the transmitted sequence of data words;

performing a parity check on each of the received pair of sequence of data words to determine whether the parity sense of one of the received pair of groups of bits of one of the received data words is opposite to the parity sense of the other one of the received pair of groups of bits of said one of the received data words.

6. A method for providing parity protection to data, such method comprising:

transmitting successive of data words in response to a sequence of clock pulses, each one of the data words having groups of bits, each one of the groups of bits having bits representative of the data and a parity bit, the parity sense of the groups of bits in such one of the data words, alternating as such groups are successively transmitted;

receiving the transmitted groups of bits successively in response to the clock pulses; and parity checking the successively received data words to determine whether the parity sense of one the pair of groups in one of the data words is opposite to the sense of said one of the groups of bits in the successively received data words.

7. A system for providing parity protection to data, such system comprising:

a data source section for transmitting a sequence of data words, each one of the data words having a pair of groups of bits, each one of the groups of bits having bits representing the data and a parity bit, the parity sense of one of the pair of groups of bits in each one of the words being opposite to the parity sense of the other one of the pair of groups of bits in such one of the data words;

a data receiver for receiving the transmitted sequence of data words;

a parity checker for performing a parity check on the received sequence of data words to determine whether the parity sense of one of the received pair of groups in one of such data word is opposite to the parity sense of the other one of the received pair of groups of bits in said one of the data words.

8. A system for providing parity protection to data, such system comprising: a data source section for transmitting successive data words in response to clock pulses, each one of the data words having groups of bits, each one of the groups of bits having bits representative of the data and a parity bit, the parity sense of one of the groups of bits in one of the data words being opposite to the parity sense of the other one of the groups of bits in such one of the data words, the parity sense of one of the groups of bits alternating as such data words are successively transmitted;

a data receiver for receiving the transmitted data words in response to the clock pulses; and a parity checker for parity checking the successively received data words to determine whether the parity sense in one of the groups of bits in one of the data words alternate with the clock pulses.

9. A method for providing parity protection to data, such method comprising:

providing a plurality of data words, each one of the words having a plurality of groups of bits, each group of bits having bits representative of the data and a parity bit, the parity sense of one of the groups of bits in each one of the data words being opposite to the parity sense of another one of the plurality of groups of bits in such one of the data words;

receiving the provided plurality of data words; and parity checking such received plurality of data words to determine whether different groups of the bits in the same one of the data words have opposite parity senses.

10. The method recited in claim 9 wherein the data words are provided sequentially in response to clock pulses.

11. A system for providing parity protection to data, such system comprising:

a data source section for providing data having a sequence of data words, each one of the data words having a plurality of groups of bits, each group of bits having a parity bit, the parity sense of one of the groups of bits of each one of the data words being different sense from the parity sense of another one of the plurality of groups of bits in such one of the data words;

a data driver for coupling the data words to a bus;

a data receiver for receiving the data words on the bus; and a data target for receiving the data words from the data receiver, such data target having a parity checker for determining whether different groups of the bits in the same data word have opposite parity senses.

12. The system recited in claim 11 wherein the different groups of bits provided by the data source section to the data driver are provided sequentially in response to clock pulses.

13. A system for providing parity protection to data, such system comprising:

a data source section for providing data having a sequence of data words, each one of the data words having a plurality of groups of bits, each group of bits having a parity bit, the parity sense of one of the groups in each one of the data words being of a different sense from the parity sense of another one of the plurality of groups of bits in said one of the data words, such groups of bits being provided sequentially in response to clock pulses, the parity sense of each group of bits alternating sequentially with the clock pulse;

a data driver for coupling the data words to a bus;

a data receiver for receiving the data words on the bus; and a data target for receiving the data words from the data receiver, such data target having a parity checker for determining whether the sense of parity of the groups of bits alternate in response to the clock pulses.

14. A method for providing parity protection to data, such method comprising:

transmitting data having a sequence of data words, each one of the data words having a plurality of groups of bits, each group of bits having a parity bit, the parity sense of one of the groups of bits in each one of the data words being of a different parity sense from another one of the plurality of groups of bits in such one of the data words, such groups of bits being provided sequentially in response to clock pulses, the parity sense of each group of bits alternating sequentially with the clock pulses;

receiving the provided data words; and parity checking such received data words to determine whether there is opposite parity sense between each group of bits and alternating parity sense between each received sequential groups of bits.

15. A system for providing parity protection to data, such system comprising:

a source of clock pulses;

a data source section for providing data having a sequence of data words in response to the clock pulses, each one of the data words having a plurality of groups of bits, each group of bits having a parity bit, the parity sense of one of the groups in each one of the data words being of a different sense from the parity sense of another one of the plurality of groups of bits in said one of the data words, such groups of bits being provided sequentially in response to clock pulses, the parity sense of each group of bits alternating sequentially with the clock pulse;

a data driver for coupling the data words to a bus;

a data receiver for receiving the data words on the bus;

a data target for receiving the data words from the data receiver, such data target having a parity checker section for determining whether the sense of parity of the groups of bits alternate in response to the clock pulses, and a pulse train checker section, responsive to the clock pulses and the parity checker for indicating a fault in the transmission of the data to the data receiver.

16. The system recited in claim 15 wherein the pulse train checker includes an up-down counter response to the clock pulses and the parity checker section.

17. The system recited in claim 16 wherein the parity checker section includes a pair of parity checkers, one for checking parity of one of the groups of bits in each one of the received data words and the other for checking parity in another one of the groups of bits in such one of the received data words.

18. The system recited in claim 17 wherein one of the parity checkers is fed to an up input of the counter, the other one of the parity checker is fed to the down input of the parity checkers and a multiple of the clock pulses is fed to a clock terminal of the counter.

19. The system recited in claim 18 wherein the multiple is greater than one.

20. The system recited in claim 19 wherein the multiple is 4.

\* \* \* \* \*